(12) United States Patent
Shibata et al.

(10) Patent No.: US 6,661,092 B2
(45) Date of Patent: Dec. 9, 2003

(54) MEMORY MODULE

(75) Inventors: Kayoko Shibata, Tokyo (JP); Yoji Nishio, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/205,040

(22) Filed: Jul. 25, 2002

(65) Prior Publication Data

US 2003/0037216 A1 Feb. 20, 2003

(30) Foreign Application Priority Data

Jul. 26, 2001 (JP) ........................................ 2001-226566

(51) Int. Cl.$^7$ ............................................... H01L 23/34
(52) U.S. Cl. ...................... 257/724; 257/686; 257/777; 365/63; 365/233
(58) Field of Search ................................ 257/685, 686, 257/724, 777

(56) References Cited

U.S. PATENT DOCUMENTS

| | | | | |
|---|---|---|---|---|
| 5,432,429 A | * | 7/1995 | Armstrong et al. | 320/136 |
| 5,955,889 A | * | 9/1999 | Taguchi et al. | 326/30 |
| 6,166,576 A | * | 12/2000 | Stave | 327/266 |
| 6,377,028 B1 | * | 4/2002 | Armstrong et al. | 320/136 |
| 6,519,173 B2 | * | 2/2003 | Funaba et al. | 365/63 |

OTHER PUBLICATIONS

DDR SDRAM Registered DIMM Design Specification, Revision 1.0, Jul. 2000; prepared by IBM, Micron Technology and Server Works, pp. i–iv and pp. 1–62.

* cited by examiner

*Primary Examiner*—David Nelms
*Assistant Examiner*—Dao H. Nguyen
(74) *Attorney, Agent, or Firm*—Hayes Soloway P.C.

(57) ABSTRACT

A memory module is provided with a resistor serving as an impedance adjuster which is connected directly or indirectly to an output terminal of an output transistor of a C/A register. The resistor adjusts the output impedance of the C/A register viewed from an input terminal of a C/A bus in such a manner that the output impedance becomes substantially constant within an operating voltage range of an internal signal output from the C/A register. The memory module is further provided with a capacitor serving as a rise time/fall time adjuster which adjusts rise time and fall time of the internal signal to specific values such that satisfactory waveforms are obtained.

21 Claims, 8 Drawing Sheets

4-DEVICE MODULE

| tR/tF \ Ron (ohm) | 15 | 20 | 25 | 30 | 35 | 63 |
|---|---|---|---|---|---|---|
| 0.5ns (3.6V/ns) | X | X | X | X | X | X |
| 0.9ns (2.0V/ns) | X | X | X | ○ | ○ | X |
| 1.0ns (1.8V/ns) | X | X | X | ○ | ○ | X |
| 2.0ns (0.9V/ns) | X | X | X | ○ | ○ | X |
| 3.0ns (0.6V/ns) | X | X | X | △ | △ | X |

9-DEVICE MODULE

| tR/tF \ Ron (ohm) | 15 | 20 | 25 | 30 | 35 | 63 |
|---|---|---|---|---|---|---|
| 0.5ns (3.6V/ns) | X | X | X | X | X | X |
| 0.9ns (2.0V/ns) | X | X | ○ | △ | X | X |
| 1.0ns (1.8V/ns) | X | X | ○ | △ | X | X |
| 2.0ns (0.9V/ns) | X | X | ○ | △ | X | X |
| 3.0ns (0.6V/ns) | X | X | X | X | X | X |

18-DEVICE MODULE

| tR/tF \ Ron (ohm) | 15 | 20 | 25 | 30 | 35 | 63 |
|---|---|---|---|---|---|---|
| 0.5ns (3.6V/ns) | X | X | X | X | X | X |
| 0.9ns (2.0V/ns) | X | ○ | △ | X | X | X |
| 1.0ns (1.8V/ns) | X | ○ | △ | X | X | X |
| 2.0ns (0.9V/ns) | X | ○ | X | X | X | X |
| 3.0ns (0.6V/ns) | X | X | X | X | X | X |

LEGEND
○ : GOOD
△ : FAIR
X : NO GOOD

FIG.9

MEMORY MODULE

BACKGROUND OF THE INVENTION

The present invention relates generally to a memory module comprising a plurality of memory devices mounted on a single substrate. More particularly, it pertains to a memory module having a register (registered memory module) as well as to a memory module having a buffer (buffered memory module).

A registered memory module is a specific type of memory module which has a command and address (C/A) register commonly used by multiple memory devices mounted on a substrate. The C/A register latches (temporarily stores) a command signal or an address signal sent to the memory module and outputs the latched (temporarily stored) command and address signals as internal signals to relevant memory devices.

Generally, a personal computer employs more than one memory device on which multiple memory devices are mounted. Therefore, if C/A signals are directly to be supplied from a central processing unit (CPU) or a chip set (memory controller) to all the memory devices, it would be necessary to drive large capacitive loads for transmitting these C/A signals. In this situation, a C/A register is provided on each memory module to decrease the capacitive loads. In this arrangement, the memory devices mounted on one memory module are driven by the C/A register mounted on the same memory module and, when viewed from the CPU or the chip set, the C/A register is the only load mounted on the memory module.

Various proposals have conventionally been made in connection with the topology of a bus connecting the C/A register and multiple memory devices. Known examples of the topology of this bus (hereinafter referred to as the internal C/A bus) include a topology having a single-layer layout and a topology having a two-layer layout, the two types of topologies being hereinafter referred to as the single T-branch topology and as the dual T-branch topology, respectively, in this Specification. One example of the dual T-branch topology is introduced in technical information titled "DDR SDRAM Registered DIMM Design Specification—Revision 1.0" available at the Web site http://www.chips.ibm.com/products/memory. One advantage of the dual T-branch topology is that it makes it possible to reduce the difference in the amounts of delays in signal transmission from the C/A register to individual devices compared to the single T-branch topology particularly when a large number of devices are mounted on the memory module.

There is a strong need in the memory device industry for improvements in data transfer rate in recent years, and this makes it necessary to increase the frequency of command and address signals.

A previously known technique for achieving high-frequency operation is to terminate bus lines. This technique has a drawback, however, in that it leads to an increase in power consumption.

SUMMARY OF THE INVENTION

It is an object of the invention to provide a registered memory module which employs a dual T-branch topology based on an unterminated bus structure to provide an improved high-frequency operating capability.

In an attempt to overcome the aforementioned problems of the related art, the inventor of this invention carried out operational tests of currently available memory module products using a technique of performance simulation. Specifically, currently available memory module products incorporating a C/A register designed to operate at 67 MHz were tested at 150 MHz by simulation. Even when the physical size of a metal-oxide-semiconductor (MOS) transistor serving as an output transistor of the C/A register was varied in various ways, it was impossible to obtain satisfactory waveforms if bus lines are not terminated. It is generally known that bus lines should be terminated to obtain satisfactory waveforms. This termination technique, however, poses another problem that it causes an increase in power consumption. Thus, the inventor has studied a method of obtaining satisfactory waveforms without using terminal resistors.

Generally, when executing this kind of waveform simulation test, waveforms are examined by substituting an impedance corresponding to a waveform input of a particular topology for a resistor. The substitute impedance used in such a test is the impedance at a point of the topology corresponding to the output transistor of the C/A register in the case of a registered memory module, for example. More particularly, it is the output impedance of the C/A register viewed from an input terminal of a C/A bus. To investigate the feasibility of various topologies, simulation tests were performed assuming the output impedance produced by the aforementioned arrangement of the resistor. As a result of the tests, the inventor succeeded in obtaining satisfactory waveforms using an unterminated dual T-branch topology rather than a single T-branch topology even when the frequency was increased up to 150 MHz.

The inventor further carried out additional simulation tests by substituting the output impedance simulated by the resistor for a MOS transistor. It was however impossible to obtain satisfactory waveforms with this arrangement.

After a careful investigation, the inventor postulated that a major cause of the aforementioned problems should exist in the fact that the transistor did not have a constant on-state resistance, that is, the transistor was not operated in its linear region. Specifically, assuming that the cause of the problems was inconstancy of the output impedance of the C/A register viewed from the input terminal of its C/A bus, the inventor presumed that the problems could be solved if the C/A bus was operated under conditions in which the output impedance of the C/A register was kept substantially constant. Based on this assumption, a resistor was connected to an output terminal of an output MOS transistor in series therewith to make the output impedance substantially constant and reexecuted a simulation test. It was however impossible again to obtain successful results.

A further investigation was carried out, from which the inventor has discovered that the gradient of the leading and trailing edges of an output pulse waveform, or the rise time (tR) and fall time (tF) of the pulse waveform, are closely related to achieving satisfactory waveforms.

The inventor of the invention has further examined the behavior of memory modules and discovered also that the output pulse waveform is related to the number of memory devices mounted on the modules.

Based on the aforementioned investigations and the results thereof, the invention provides the following memory modules as means for overcoming the problems of the related art.

A first memory module of the invention comprises a command/address register device for generating an internal signal according to an external command/address signal, the command/address register device having an output transistor, a plurality of memory devices divided into first and second groups, wiring interconnecting the command/address register device and the memory devices, and a substrate on which the command/address register device and the multiple memory devices are mounted. In this memory module, the wiring includes a first wiring section extending from the command/address register device to a first branch point, a second wiring section extending from the first branch point to a second branch point, a third wiring section extending from the first branch point to a third branch point, a fourth wiring section which branches out from the second branch point and extends up to the memory devices of the first group, and a fifth wiring section which branches out from the third branch point and extends up to the memory devices of the second group, and the command/address register device includes an impedance adjuster for adjusting the output impedance of the command/address register device viewed from a junction point between the command/address register device and the first wiring section in such a manner that the output impedance of the command/address register device becomes substantially constant within an operating voltage range of the internal signal, and a rise time/fall time adjuster for adjusting rise time and fall time of the internal signal to specific values.

A second memory module of the invention, which is a variation of the aforementioned first memory module, is characterized in that neither of the multiple memory devices nor the wiring is terminated.

A third memory module of the invention, which is a variation of the aforementioned first memory module, is characterized in that the command/address register device is a command/address register including the aforementioned output transistor and having a register output terminal, the command/address register device including a resistor connected to the register output terminal, the resistor serving as the impedance adjuster.

A fourth memory module of the invention, which is a variation of the aforementioned first memory module, is characterized in that the command/address register device is a command/address register incorporating a resistor serving as the impedance adjuster.

A fifth memory module of the invention, which is a variation of the aforementioned first memory module, is characterized in that the impedance adjuster includes first and second resistors, and the command/address register device is a command/address register having a register output terminal and includes the second resistor connected to the register output terminal, the command/address register including the output transistor and the first resistor which is connected between an output terminal of the output transistor and the register output terminal.

A sixth memory module of the invention, which is a variation of the aforementioned fifth memory module, is characterized in that the resistance of the first resistor is set to a value which is smallest in consideration of potentially selected numbers of the memory devices, and the resistance of the second resistor is set to a value to be added to the resistance of the first resistor for properly adjusting the output impedance of the command/address register device.

A seventh memory module of the invention, which may be a variation of any one of the aforementioned first to sixth memory modules, is characterized in that the Command/address register incorporates a capacitor serving as the rise time/fall time adjuster.

An eighth memory module of the invention, which is a variation of the aforementioned first memory module, is characterized in that the impedance adjuster adjusts the output impedance of the command/address register device according to the number of the memory devices mounted on the substrate.

A ninth memory module of the invention, which may be a variation of either of the aforementioned third to fourth memory modules, is characterized in that the resistance of the resistor is larger than the on-state resistance of the output transistor.

A tenth memory module of the invention, which is a variation of the aforementioned fifth memory module, is characterized in that the combined resistance of the first and second resistors is larger than the on-state resistance of the output transistor.

An eleventh memory module of the invention, which is a variation of the aforementioned first memory module, is characterized in that the specific values of the rise time and the fall time remain constant regardless of the potentially selected numbers of the memory devices.

A twelfth memory module of the invention, which is a variation of the aforementioned eleventh memory module, is characterized in that the frequency of the internal signal is at least 100 MHz.

A thirteenth memory module of the invention, which is a variation of the aforementioned twelfth memory module, is characterized in that the rise time and the fall time fall within a range of 0.9 ns to 2.0 ns.

A fourteenth memory module of the invention, which is a variation of the aforementioned first memory module, is characterized in that the number of the memory devices of the first group is larger than the number of the memory devices of the second group by a specific number and all the memory devices have substantially the same input capacitance with one another, the memory module further comprising the aforementioned specific number of dummy capacitors connected to the fifth wiring section together with the memory devices of the second group, each of the dummy capacitors having substantially the same input capacitance as the individual memory devices, wherein the combined impedance of the memory devices of the first group viewed from the second branch point is equal to the combined impedance of the memory devices of the second group and the dummy capacitors viewed from the third branch point.

A fifteenth memory module of the invention, which is a variation of the aforementioned fourteenth memory module, is characterized in that the second and third wiring sections have equal line impedance and the fourth and fifth wiring sections have equal line impedance.

A sixteenth memory module of the invention, which is a variation of the aforementioned fourteenth memory module, is characterized in that the fourth wiring section forms a local topology in which nodes of the memory devices of the first group are arranged symmetrically with respect to a first imaginary line passing through the second branch point, and the fifth wiring section forms a local topology in which nodes of the memory devices of the second group and the aforementioned specific number of the dummy capacitors are arranged symmetrically with respect to a second imaginary line passing through the third branch point, A seventeenth memory module of the invention, which is a variation of the aforementioned first memory module, is characterized in that the number of the memory devices of the first group is larger than the number of the memory devices of the second group by a specific number and all the memory devices have substantially the same input capacitance with one another, and line lengths of the second to fifth wiring sections are determined in such a manner that the combined impedance of the memory devices of the first group viewed from the first branch point is equal to the combined impedance of the memory devices of the second group viewed from the first branch point.

An eighteenth memory module of the invention, which is a variation of the aforementioned first memory module, is characterized in that the number of the memory devices of the first group is 8 or 10 while the number of the memory devices of the second group is 8, and the line impedance of the first to fifth wiring sections substantially falls within a range of 50 to 65 ohms while the output impedance of the command/address register device is 20 ohms ±20%.

A nineteenth memory module of the invention, which is a variation of the aforementioned first memory module, is characterized in that the number of the memory devices of the first group is 4 or 5 while the number of the memory devices of the second group is 4, and the line impedance of the first to fifth wiring sections substantially falls within a range of 50 to 65 ohms while the output impedance of the command/address register device is 25 ohms ±20%.

A twentieth memory module of the invention, which is a variation of the aforementioned first memory module, is characterized in that the number of the memory devices of the first group is 2 or 3 while the number of the memory devices of the second group is 2, and the line impedance of the first to fifth wiring sections substantially falls within a range of 50 to 65 ohms while the output impedance of the command/address register device is 30 ohms ±20%.

A twenty-first memory module of the invention, which is a variation of the aforementioned first memory module, is characterized in that the memory module comprises a buffer device including the impedance adjuster and the rise time/fall time adjuster instead of the command/address register device.

As would be understood from the foregoing, the invention provides a registered or buffered memory module employing the dual T-branch topology based on the unterminated bus structure having a high-frequency operating capability with the provision of an impedance adjuster for adjusting the output impedance of a C/A register or buffer viewed from an input terminal an internal C/A bus and a rise time/fall time adjuster for adjusting rise time and fall time of an internal signal output from the C/A register or buffer to the internal C/A bus.

These and other objects, features and advantages of the invention will become more apparent upon reading the following detailed description in conjunction with the accompanying drawings.

BRIEF OF DESCRIPTION OF THE DRAWINGS

FIG. 9 is a diagram showing the relationship between tR/tF adjustment and waveforms.

DESCRIPTION OF PREFERRED EMBODIMENTS

Memory modules according to specific embodiments of the invention are now described in detail with reference to the drawings. The memory modules described hereunder, by way of example, are of a type operating at reference clock frequencies of 200 to 400 MHz and provided with a C/A register operating at 100 to 200 MHz as well as dynamic random-access memories (DRAMs) as memory devices. It is not meant, however, to exclude the applicability of the invention to other types of memory modules. In addition, although typical values of resistances and other parameters are indicated in the following embodiments, it is to be understood that variations of about ±20% in these values are allowed in the light of large-scale industrial productivity.

(First Embodiment)

Figure 1:
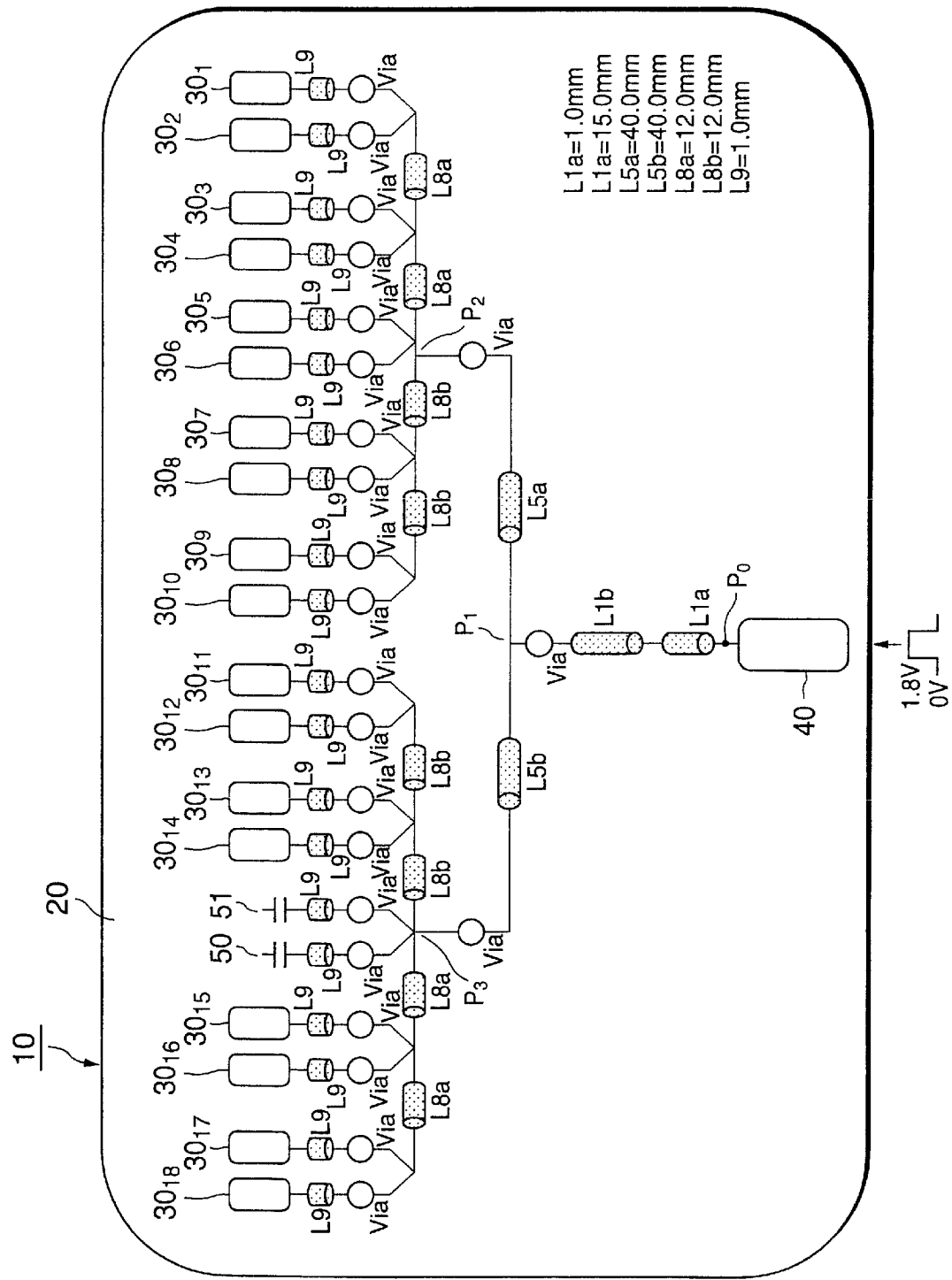
FIG. 1 is a general configuration diagram of a memory module according to a first embodiment of the invention.

Shown in FIG. 1 is a memory module 10 according to a first embodiment of the invention comprising eighteen DRAM devices $30_1$–$30_{18}$ and a C/A register 40 mounted on a substrate 20. All the DRAM devices $30_1$–$30_{18}$ have the same characteristics featuring an error checking and correcting (ECC) function. In this embodiment, the DRAM devices $30_1$–$30_{18}$ are divided into two groups: the first group including the DRAM devices $30_1$ to $30_{10}$ and the second group including the DRAM devices $30_{11}$ to $30_{18}$. It should be apparent that the number of DRAM devices of the first group is larger than that of the second group with a difference of two. While the memory module 10 is provided with power lines and data lines in addition to command and address lines, the following discussion focuses primarily on the command and address lines for the sake of clarity of explanation.

An output terminal $P_0$ of the C/A register 40 is connected to the individual DRAM devices $30_1$–$30_{18}$ by signal lines L1a, L1b, L5a, L5b, L8a, L8b, L9 and via holes Via, thereby configuring a dual T-branch topology of this embodiment. The dual T-branch topology of the embodiment is generally formed of first to fifth wiring sections. Of these wiring sections, the first wiring section includes the signal lines L1a, L1b and one via hole Via, extending from the output terminal $P_0$ of the C/A register 40 to a first branch point $P_1$. The second wiring section includes the signal line L5a and one via hole Via, extending from the first branch point $P_1$ to a second branch point $P_2$. The third wiring section includes the signal line L5b and one via hole Via, extending from the first branch point $P_1$ to a third branch point $P_3$. The fourth wiring section branches out from the second branch point $P_2$, individual branched lines extending up to the DRAM devices $30_1$–$30_{10}$ of the first group. Similarly, the fifth wiring section branches out from the third branch point $P_3$, individual branched lines extending up to the DRAM devices $30_{11}$–$30_{18}$ of the second group.

Figure 2:
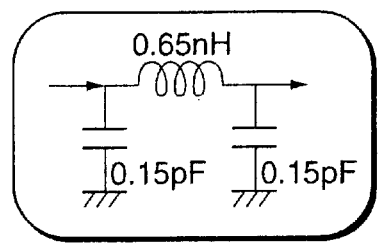
FIG. 2 is a simplified equivalent circuit diagram of each via hole shown in FIG. 1.

More specifically, the lines L1a, L1b, L5a, L5b, L8a, L8b and L9 are 1.0 mm, 15.0 mm, 40.0 mm, 40.0 mm, 12.0 mm, 12.0 mm and 1.0 mm long, respectively, together producing a line impedance of 63 ohms in the illustrated example. A generally equivalent circuit diagram of each via hole Via of the present embodiment is shown in FIG. 2.

Figure 3:
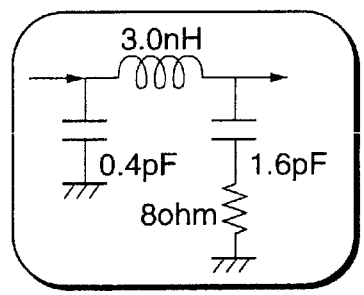
FIG. 3 is a simplified equivalent circuit diagram of an input portion of each DRAM device shown in FIG. 1.

In this embodiment, two dummy capacitors 50, 51 are connected to the fifth wiring section as are the DRAM devices $30_{11}$–$30_{18}$ of the second group. These dummy capacitors 50, 51 each have substantially the same capacitance as the input capacitance of each of the DRAM devices $30_1$–$30_{18}$. This means that the dummy capacitors 50, 51 serve as equivalent input capacitance of each DRAM device, an equivalent circuit diagram of which input portion is shown in FIG. 3. The equivalent circuit diagram of each of the DRAM devices $30_1$–$30_{18}$ as illustrated in FIG. 3 is 2.0 pF. Accordingly, the capacitance of each dummy capacitor 50, 51 is 2.0 pF in this embodiment. With the provision of these dummy capacitors 50, 51, the combined impedance of the DRAM devices $30_1$–$30_{10}$ viewed from the second branch point $P_2$ and the combined impedance of the DRAM devices $30_{11}$–$30_{18}$ and the dummy capacitors 50, 51 viewed from the third branch point $P_3$ are substantially equal to each other in this embodiment. This means that the input impedance of the DRAM devices $30_1$–$30_{10}$ at the second branch point $P_2$ is substantially equal to that of the DRAM devices $30_{11}$–$30_{18}$ at the third branch point $P_3$.

As is apparent from the number of the via holes Via, line lengths and their layout shown in FIG. 1, bus topology of this embodiment has axial symmetry with respect to an imaginary line passing through the first branch point $P_1$ and the lines L1a, L1b. In particular, the lines L5a, L5b have the same wiring length with each other. The fourth wiring, section forms a first local topology in which nodes of the DRAM devices $30_1$–$30_{10}$ and the dummy capacitors 50 and 51 are arranged symmetrically with respect to an imaginary line passing through the second branch point $P_2$, or the straight line passing between the DRAM devices $30_5$ and $30_6$, whereas the fifth wiring section forms a second local topology in which nodes of the DRAM devices $30_{11}$–$30_{18}$ and the dummy capacitors 50, 51 are arranged symmetrically with respect to an imaginary line passing through the third branch point $P_3$, or the straight line passing between the dummy capacitors 50 and 51. The first local topology is equivalent to the second local topology, so that the dual T-branch topology according to the embodiment has a well-balanced symmetrical geometry with respect to the first and second groups of the DRAM devices $30_1$–$30_{10}$, $30_{11}$–$30_{18}$.

Figure 4:
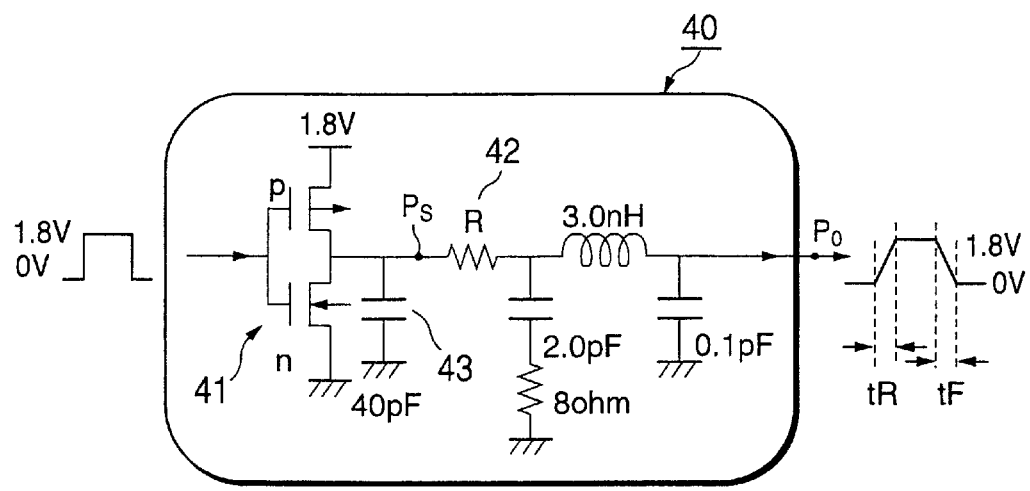
FIG. 4 is a diagram showing the general circuit configuration of a C/A register shown in FIG. 1.

Referring to FIG. 4, the C/A register 40 includes a CMOS inverter 41, a resistor 42 having an electrical resistance R connected to an output terminal of the CMOS inverter 41 in series, and a capacitor 43 of which one end is connected to the output terminal of the CMOS inverter 41 and the other end is grounded. The physical sizes and, accordingly, characteristics of nMOS and pMOS transistors constituting the CMOS inverter 41 of this embodiment are such that they individually produce an on-state resistance of 5 ohms in a linear region. An 8-ohm resistor, 2.0 pF and 0.1 pF capacitors and a 3.0 nH inductor shown in a succeeding stage of the resistor 42 together indicate an equivalent circuit representing parasitic impedance components produced by a package and other elements between the resistor 42 and the output terminal $P_0$ of the C/A register 40. In a case where the memory module 10 is provided with the C/A register 40 rather than with a mere buffer, there is actually provided an internal signal generating circuit formed of a flip-flop, for example, in a preceding stage of the CMOS inverter 41. Such internal signal generating circuit is not illustrated in the foregoing description of this embodiment, however, for the sake of simplicity.

In this embodiment, the resistance R of the resistor 42 is determined such that the output impedance of the C/A register 40 viewed from an input terminal of the line L1a of the first wiring section (or from the output terminal $P_0$ of the C/A register 40) becomes constant within an operating voltage range. In other words, the resistance R of the resistor 42 is determined such that a linear current-voltage characteristic is obtained at the input terminal of the line L1a of the first wiring section (the output terminal $P_0$ of the C/A register 40) in the present embodiment.

Figure 5:
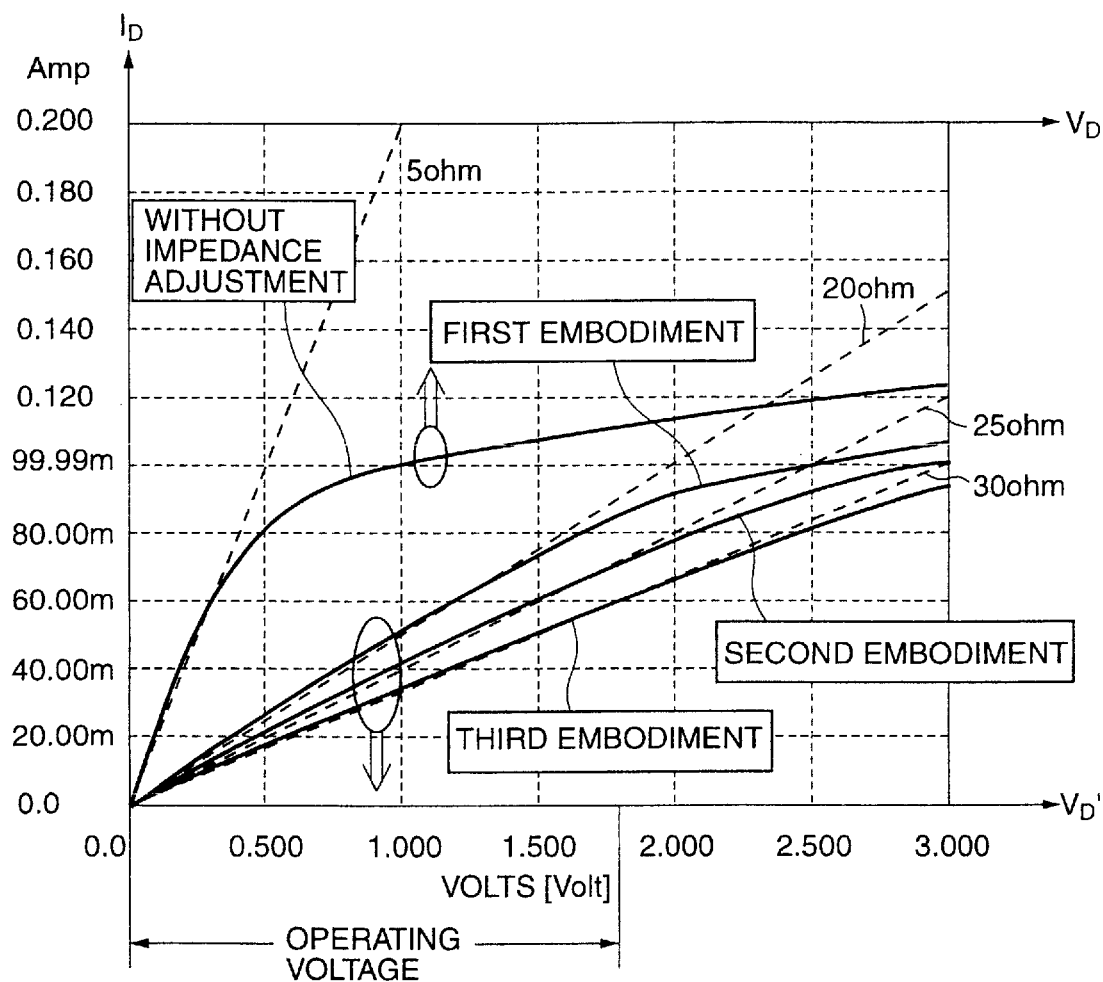
FIG. 5 is a diagram for explaining the output impedance of the C/A register viewed from an input terminal of a first wiring section particularly when an n-channel MOS (nMOS) transistor of a complementary MOS (CMOS) inverter constituting an output stage of the C/A register is in an ON state.
Figure 6:
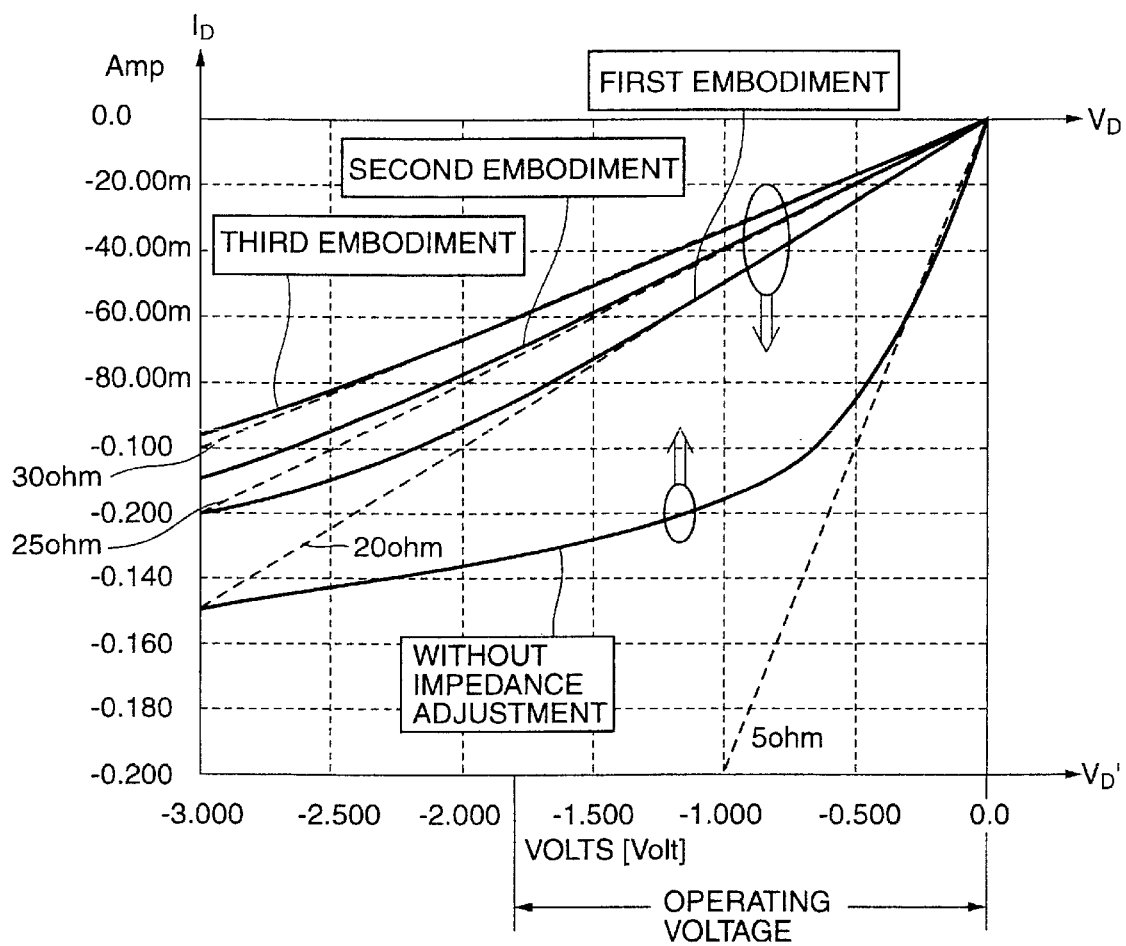
FIG. 6 is a diagram for explaining the output impedance of the C/A register viewed from the input terminal of the first wiring section particularly when a p-channel MOS (PMOS) transistor of the CMOS inverter constituting the output stage of the C/A register is in an ON state.

The relationship between the output impedance of the C/A register 40 and the resistance R of the resistor 42 is now described with reference to FIGS. 5 and 6, of which FIG. 5 shows the characteristics of the nMOS transistor of the CMOS inverter 41 constituting an output stage of the C/A register 40 and FIG. 6 shows the characteristics of the pMOS transistor of the CMOS inverter 41. In these Figures, designated by $I_D$ and $V_D$ are drain current and drain voltage of the nMOS and pMOS transistors of the CMOS inverter 41, respectively, and designated by $V_{D'}$ is voltage at the input terminal of the line L1a of the first wiring section, which is identical to the output terminal $P_0$ of the C/A register 40 in the first embodiment and corresponds to a point P4 in later-described second and third embodiments. It is to be noted that FIGS. 5 and 6 contain a representation of characteristics of the second and third embodiments as well.

Generally, an $I_D$–$V_D$ characteristic of a MOS transistor is formed of a resistance region (linear region) and a saturation region (pinchoff region). Ideally, the drain current $I_D$ remains constant regardless of the drain voltage $V_D$. This means that the on-state resistance of the transistor varies with the drain voltage $V_D$. In the $I_D$–$V_D$ characteristics shown in FIGS. 5 and 6, for example, the linear region ranges from 0 V to approximately ±0.3 V, beyond which extends the saturation region in which the drain current $I_D$ varies only gently with variations in the drain voltage $V_D$. The on-state resistance of the nMOS and pMOS transistors (i.e., the resistance of the MOS transistor during operation in the linear region) of the illustrated example is 5 ohms.

On the other hand, the operating voltage range of an internal C/A bus of this embodiment, or the voltage range of its internal signals, is 0 to 1.8 V. It is apparent from FIGS. 5 and 6 that this voltage range is not covered by the linear region of either the nMOS transistor or the pMOS transistor but extends to their saturation regions.

Assuming that a cause of an inability to obtain favorable waveforms during high-frequency operation is variations in the on-state resistance of the nMOS and pMOS transistors, the inventor of this invention series-connected the resistor 42 to the output terminal of the output transistor (CMOS inverter 41) as previously stated, where the resistance value was determined in the above-described manner.

With this arrangement, maximum and minimum values that the drain voltage $V_D$ of the nMOS or pMOS transistor can take is increased or decreased, respectively, by the resistor 42 and the operating voltage ranges of the nMOS and pMOS transistors fall within the linear region due to their characteristics as shown in FIGS. 5 and 6. With reference to the potential $V_{D'' \text{ on the output terminal } P_0}$ of the C/A register 40, which can be regarded as an apparent drain voltage when viewed from the side of the line L1a of the first wiring section, on the other hand, the operating voltage range of the internal C/A bus falls within the linear region of the $I_D$–$V_{D'}$ characteristics. It follows that the operating voltage range falls within a range in which the output impedance of the C/A register 40 viewed from the input terminal of the line L1a of the first wiring section can be regarded as being constant.

More specifically, the resistance R of the resistor 42 is determined by the aforementioned bus topology, that is, by such parameters as the number of the DRAM devices mounted and the line impedance. Alternatively, the resistance R of the resistor 42 is determined based on a relation with the input impedance of the side of the DRAM devices $30_1$–$30_{18}$ viewed from the output terminal $P_0$ of the C/A register 40. In this embodiment, an optimum impedance of 20 ohms was obtained by simulation on the grounds that the number of DRAM devices mounted was 18, the line impedance was 63 ohms and the dual T-branch topology was employed as C/A bus topology as described above. Considering then that the on-state resistance of the CMOS transistor in its linear region was 5 ohms, the resistance R was set to 15 ohms such that the operating voltage range of the C/A bus would fall within the linear region of the $I_D$–$V_{D'}$ characteristics and the output impedance of the C/A register 40 at its output terminal $P_0$ would become 20 ohms.

While the resistor 42 is built in the C/A register 40 in this embodiment, it may be inserted in series with the C/A register 40 between its output terminal $P_0$ and the line L1a.

In the C/A register 40 of this embodiment, the capacitor 43 serves as a tR/tF adjuster for adjusting the rise time (tR) and fall time (tF) of a pulse signal. The capacitor 43 provided in an output stage of the CMOS inverter 41 serves to "dull" the waveform of the pulse signal output from the CMOS inverter 41. Specifically, the waveform of an ideally rectangular pulse output from the CMOS inverter 41 is deformed into a trapezoidal pulse having specific tR and tF values (1 ns) as observed at point $P_S$ shown in FIG. 4 due to the presence of the capacitor 43. The provision of the capacitor 43 which performs the tR/tF adjustment in addition to the aforementioned resistor 42 makes it possible to obtain a better waveform. The tR/tF adjustment will be later discussed in detail.

It is to be noted that the above-described first embodiment is also applicable to memory modules having no ECC function without otherwise altering its structure, in which case the number of DRAM devices mounted would be 16 with the first and second groups containing the same number of DRAM devices.

In addition, while the line impedance is 63 ohms as described in the foregoing first embodiment, it may take any value as long as it falls within a range of 50 to 65 ohms.

(Second Embodiment)

A memory module 11 according to a second embodiment of the invention carries nine DRAM devices and can be regarded as a variation of the first embodiment as its layout is modified due to the change in the number of DRAM devices.

Figure 7:
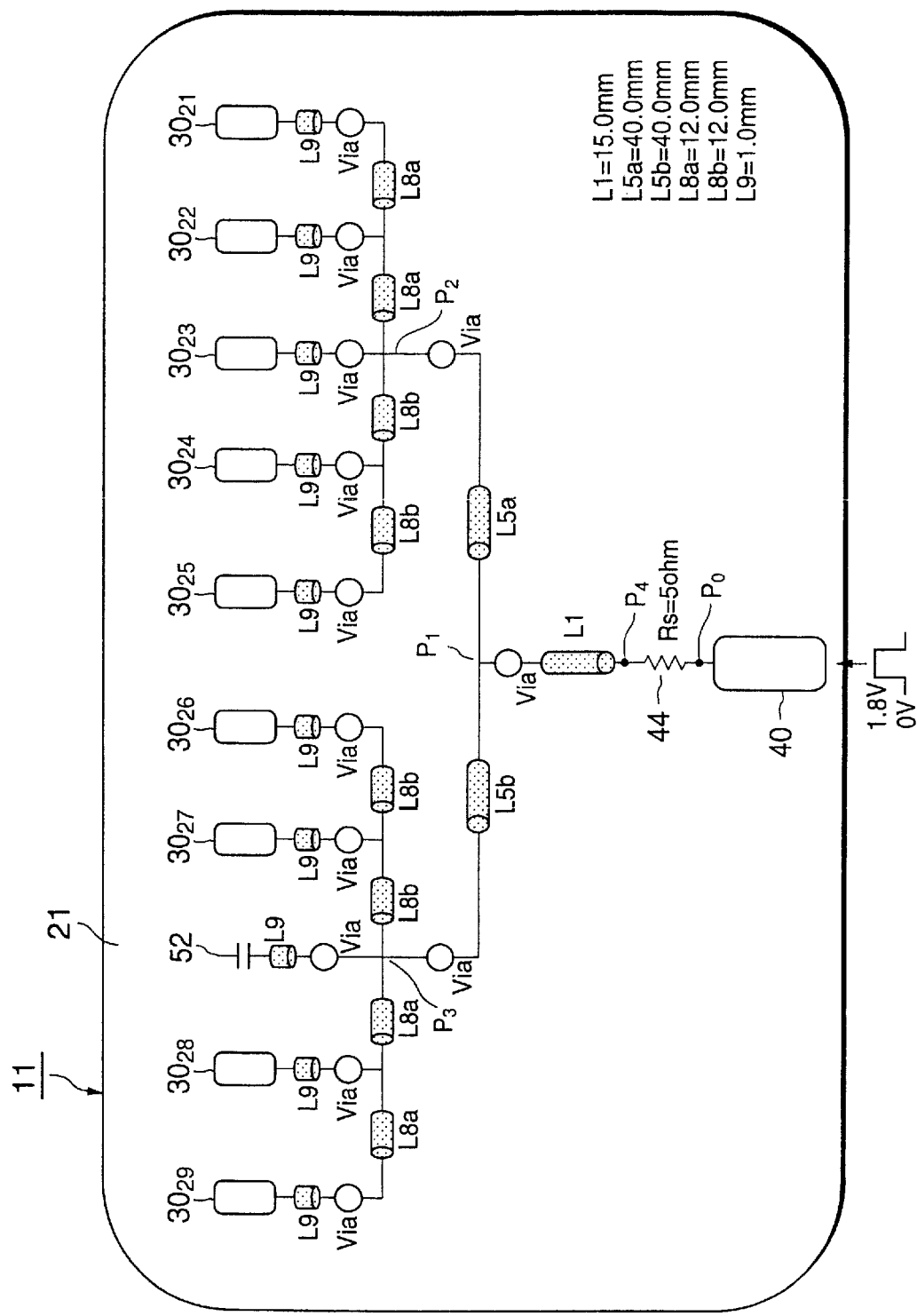
FIG. 7 is a general configuration diagram of a memory module according to a second embodiment of the invention.

As shown in FIG. 7, the memory module 11 of the second embodiment comprises nine DRAM devices $30_{21}$–$30_{29}$, a C/A register 40 and an additional resistor 44 having an electrical resistance Rs mounted on a substrate 21, the resistor 44 being connected to an output terminal $P_0$ of the C/A register 40 in series therewith. All the DRAM devices $30_{21}$–$30_{29}$ have the same characteristics featuring the ECC function. In this embodiment, the DRAM devices $30_{21}$–$30_{29}$ are divided into two groups: the first group including the DRAM devices $30_{21}$ to $30_{25}$ and the second group including the DRAM devices $30_{26}$ to $30_{29}$. Apparently, the number of DRAM devices of the first group is larger than that of the second group with a difference of one.

A terminal end P4 of the additional resistor 44 is connected to the individual DRAM devices $30_{21}$–$30_{29}$ by signal lines L1, L5a, L5b, L8a, L8b, L9 and via holes Via, thereby configuring a dual T-branch topology of this embodiment. The dual T-branch topology of the embodiment is generally formed of first to fifth wiring sections. Of these wiring sections, the first wiring section includes the signal lines L1 and one via hole Via, extending from the output terminal end P4 of the additional resistor 44 to a first branch point $P_1$. The second wiring section includes the signal line L5a and one via hole Via, extending from the first branch point $P_1$ to a second branch point $P_2$. The third wiring section includes the signal line L5b and one via hole Via, extending from the first branch point $P_1$ to a third branch point $P_3$. The fourth wiring section branches out from the second branch point $P_2$, individual branched lines extending up to the DRAM devices $30_{21}$–$30_{25}$ of the first group. Similarly, the fifth wiring section branches out from the third branch point $P_3$, individual branched lines extending up to the DRAM devices $30_{26}$–$30_{29}$ of the second group.

More specifically, the lines L1, L5a, L5b, L8a, L8b and L9 are 15.0 mm, 40.0 mm, 40.0 mm, 12.0 mm, 12.0 mm and 1.0 mm long, respectively, together producing a line impedance of 63 ohms in the illustrated example. The via holes Via, the DRAM devices $30_{21}$–$30_{29}$ and the C/A register 40 of this embodiment have the same characteristics as the via holes Via, the DRAM devices $30_1$–$30_{18}$ and the C/A register of the first embodiment (refer to FIGS. 2 to 4).

In this embodiment, a dummy capacitor 52 having an equivalent input capacitance of 2.0 pF is connected to the fifth wiring section as are the DRAM devices $30_{26}$–$30_{29}$ of the second group to make up for the difference in the number of DRAM devices between the first and second groups. With the provision of the dummy capacitor 52, the combined impedance of the DRAM devices $30_{21}$–$30_{25}$ viewed from the second branch point $P_2$ and the combined impedance of the DRAM devices $30_{26}$–$30_{29}$ and the dummy capacitor 52 viewed from the third branch point $P_3$ are substantially equal to each other in this embodiment.

As is apparent from the number of the via holes Via, line lengths and their layout shown in FIG. 7, bus topology of this embodiment also has axial symmetry with respect to an imaginary line passing through the first branch point $P_1$ and the line L1. In particular, the lines L5a, L5b have the same wiring length with each other, and the fourth and fifth wiring sections form first and second local topologies in which nodes connected one another are arranged symmetrically with respect to imaginary lines passing through the second and third branch points $P_2$, $P_3$, respectively. The first local topology is equivalent to the second local topology, so that the dual T-branch topology according to the embodiment has a well-balanced symmetrical geometry with respect to the first and second groups of the DRAM devices $30_{21}$–$30_{25}$, $30_{26}$–$30_{29}$ as is the case with the first embodiment.

The C/A register 40 of this embodiment is identical to the C/A register of the foregoing first embodiment as stated above. Specifically, the C/A register 40 of this embodiment also includes a CMOS inverter 41, a resistor 42 having an electrical resistance R connected to an output stage of the CMOS inverter 41 in series, and a capacitor 43 of which one end is connected to the output stage of the CMOS inverter 41 and the other end is grounded.

In this embodiment, the additional resistor 44 having the resistance Rs connected to the output terminal $P_0$ of the C/A register 40 in series therewith and the resistor 42 having the resistance R built in the C/A register 40 together determine the output impedance of the C/A register 40 viewed from the point P4, wherein the same principle as used in the aforementioned first embodiment is used in determining the output impedance (refer to FIGS. 5 and 6). Specifically, the value of the combined resistance of the resistor 42 and the resistor 44 (R+Rs) is chosen such that produces together with the output transistor of the C/A register 40 constant output impedance for a specific amplitude of pulses. In other words, the value of the combined resistance (R+Rs) is determined in a manner that a linear current-voltage characteristic is obtained at the input terminal of the line L1 of the first wiring section (point P4) in the present embodiment.

The combined resistance of the resistor 42 and the resistor 44 (R +Rs) of this embodiment is determined in substantially the same fashion as the resistance R of the resistor 42 is determined in the first embodiment. The resistance Rs of the resistor 44 is obtained by subtracting the resistance R of the resistor 42 from the value of the combined resistance (R+Rs) which is so determined to satisfy the aforementioned conditions. Specifically, an optimum impedance of 25 ohms was obtained by simulation on the grounds that the number of DRAM devices mounted was nine, the line impedance was 63 ohms and the dual T-branch topology was employed as C/A bus topology as described above. Considering then that the on-state resistance of the CMOS transistor in its linear region was 5 ohms and the resistance R of the resistor 42 was 15 ohms, the resistance Rs was set to 5 ohms such that the operating voltage range of the C/A bus would fall within the linear region of the $I_D$–$V_{D'}$ characteristics (refer to FIGS. 5 and 6) and the output impedance of the C/A register 40 viewed from the point P4 would become 25 ohms. According to the invention, the resistor 44 may be built in the C/A register 40 like the resistor 42 of the first embodiment.

It is to be noted that the above-described second embodiment is also applicable to memory modules having no ECC function without otherwise altering its structure, in which case the number of DRAM devices mounted would be 8 with the first and second groups containing the same number of DRAM devices.

In addition, while the line impedance is 63 ohms as described in the foregoing second embodiment, it may take any value as long as it falls within a range of 50 to 65 ohms.

(Third Embodiment)

A memory module 12 according to a third embodiment of the invention carries four DRAM devices and can be regarded as a variation of the first embodiment as its layout is modified due to the change in the number of DRAM devices.

Figure 8:
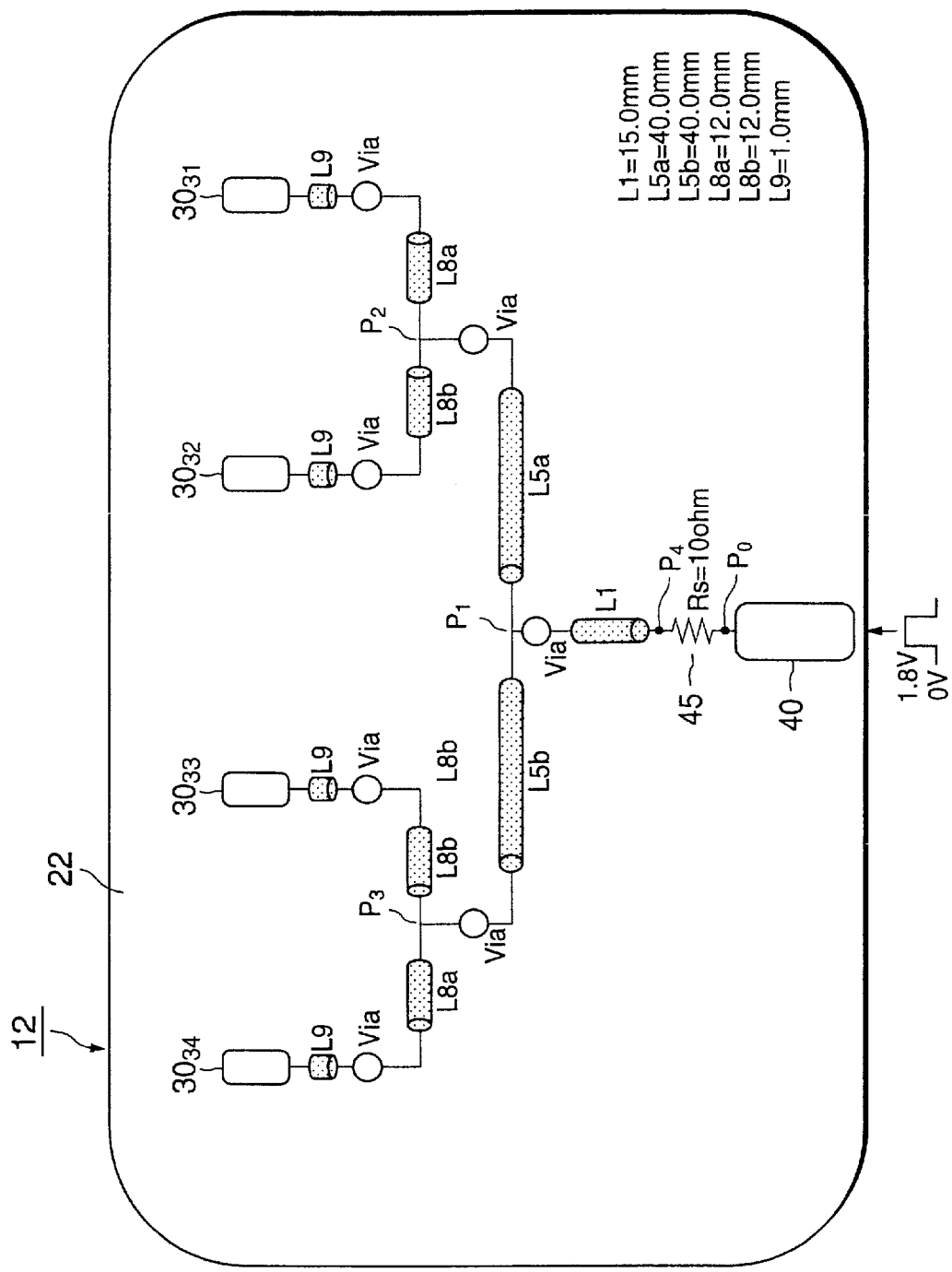
FIG. 8 is a general configuration diagram of a memory module according to a third embodiment of the invention.

As shown in FIG. 8, the memory module 12 of the third embodiment comprises four DRAM devices $30_{31}$–$30_{34}$, a C/A register 40 and an additional resistor 45 having an electrical resistance Rs mounted on a substrate 22, the resistor 45 being connected to an output terminal $P_0$ of the C/A register 40 in series therewith. All the DRAM devices $30_{31}$–$30_{34}$ have the same characteristics. In this embodiment, the DRAM devices $30_{31}$–$30_{34}$ are divided into two groups, the first group and the second group, each including the same number of DRAM devices.

A terminal end P4 of the additional resistor 45 is connected to the individual DRAM devices $30_{31}$–$30_{34}$ by signal lines L1, L5a, L5b, L8a, L8b, L9 and via holes Via, thereby configuring a dual T-branch topology of this embodiment. The dual T-branch topology of the embodiment is generally formed of first to fifth wiring sections. Of these wiring sections, the first wiring section includes the signal lines L1 and one via hole Via, extending from the output terminal end P4 of the additional resistor 45 to a first branch point $P_1$. The second wiring section includes the signal line L5a and one via hole Via, extending from the first branch point $P_1$ to a second branch point $P_2$. The third wiring section includes the signal line L5b and one via hole Via, extending from the first branch point $P_1$ to a third branch point $P_3$. The fourth wiring section branches into two paths from the second branch point $P_2$, one (including the lines L8a, L9 and one via hole Via) extending up to the DRAM device $30_{31}$ and the other (including the lines L8b, L9 and one via hole Via) extending up to the DRAM device $30_{32}$. Similarly, the fifth wiring section branches into two paths from the third branch point $P_3$, one (including the lines L8b, L9 and one via hole Via) extending up to the DRAM device $30_{33}$ and the other (including the lines L8a, L9 and one via hole Via) extending up to the DRAM device $30_{34}$.

More specifically, the lines L1, L5a, L5b, L8a, L8b and L9 are 15.0 mm, 40.0 mm, 40.0 mm, 12.0 mm, 12.0 mm and 1.0 mm long, respectively, together producing a line impedance of 63 ohms in the illustrated example. The via holes Via, the DRAM devices $30_{31}$–$30_{34}$ and the C/A register 40 of this embodiment have the same characteristics as the via holes Via, the DRAM devices $30_1$–$30_{18}$ and the C/A register of the first embodiment (refer to FIGS. 2 to 4).

As is apparent from the number of the via holes Via, line lengths and their layout shown in FIG. 8, bus topology of this embodiment also has axial symmetry with respect to an imaginary line passing through the first branch point $P_1$ and the line L1. In particular, the lines L5a, L5b have the same wiring length with each other, and the fourth and fifth wiring sections form first and second local topologies in which nodes connected one another are arranged symmetrically with respect to imaginary lines passing through the second and third branch points $P_2$, $P_3$, respectively. The first local topology is equivalent to the second local topology, so that the dual T-branch topology according to the embodiment has a well-balanced symmetrical geometry with respect to the first and second groups of the DRAM devices $30_{31}$–$30_{32}$, $30_{33}$–$30_{34}$ as is the case with the first embodiment.

The C/A register 40 of this embodiment is identical to the C/A register of the foregoing first embodiment as stated above. Specifically, the C/A register 40 of this embodiment also includes a CMOS inverter 41, a resistor 42 having an electrical resistance R connected to an output stage of the CMOS inverter 41, and a capacitor 43 of which one end is connected to the output stage of the CMOS inverter 41 and the other end is grounded.

In this embodiment, the additional resistor 45 having the resistance Rs connected to the output terminal $P_0$ of the C/A register 40 in series therewith is selected in the same manner as described in the foregoing second embodiment (refer to FIGS. 5 and 6). Particularly in this embodiment, an optimum impedance of 30 ohms was obtained by simulation on the grounds that the number of DRAM devices mounted was four, the line impedance was 63 ohms and the dual T-branch topology was employed as C/A bus topology as described above. Considering then that the on-state resistance of the CMOS transistor in its linear region was 5 ohms and the resistance R of the resistor 42 was 15 ohms, the resistance Rs was set to 10 ohms such that the operating voltage range of the C/A bus would fall within the linear region of the $I_D$–$V_{D'}$ characteristics and the output impedance of the C/A register 40 viewed from the point P4 would become 30 ohms. According to the invention, the resistor 45 may be built in the C/A register 40 like the resistor 42 of the first embodiment. While the above-described memory module 12 of the third embodiment does not incorporate the ECC function, the concept of this embodiment is applicable to memory modules having the ECC function. Specifically, the embodiment may be modified such that three DRAM devices belong to the first group whereas two DRAM devices belong to the second group without otherwise altering its structure. In addition, while the line impedance is 63 ohms in the above-described third embodiment, it may take any value as long as it falls within a range of 50 to 65 ohms.

[Adjustment of Rise Time and Fall Time]

Referring now to FIG. 9, the earlier-mentioned tR/tF adjustment is described below. FIG. 9 shows results of our investigation for determining an appropriate degree of tR/tF adjustment that would provide satisfactory pulse waveforms with different numbers of DRAM devices mounted on the memory module. Each value of resistance designated Ron in FIG. 9 is the output impedance of the C/A register 40 viewed from the point P0 in FIG. 1 and from the point P4 as depicted in FIGS. 7 and 8. It is obvious from FIG. 9 that satisfactory waveforms are obtained when rise time and fall time are 0.9 ns, 1.0 ns and 2.0 ns regardless of the number of DRAM devices mounted on the memory module. From this standpoint, the rise time and fall time were set to 1.0 ns in the foregoing embodiments. With this arrangement, actual values of the rise time and fall time would slightly differ due to manufacturing variations but should fall within a range of 0.9 ns to 2.0 ns, which is appropriate to produce satisfactory pulse waveforms regardless of the number of DRAM devices mounted.

(Fourth Embodiment)

A memory module 14 according to a fourth embodiment of the invention is a variation of the first embodiment and is substantially identical to the memory module 10 of the first embodiment except that the balance of impedance is adjusted without using dummy capacitors. Specifically, first to fifth wiring sections are differentiated from one another in terms of line length to achieve a balance of impedance in this embodiment.

Figure 10:
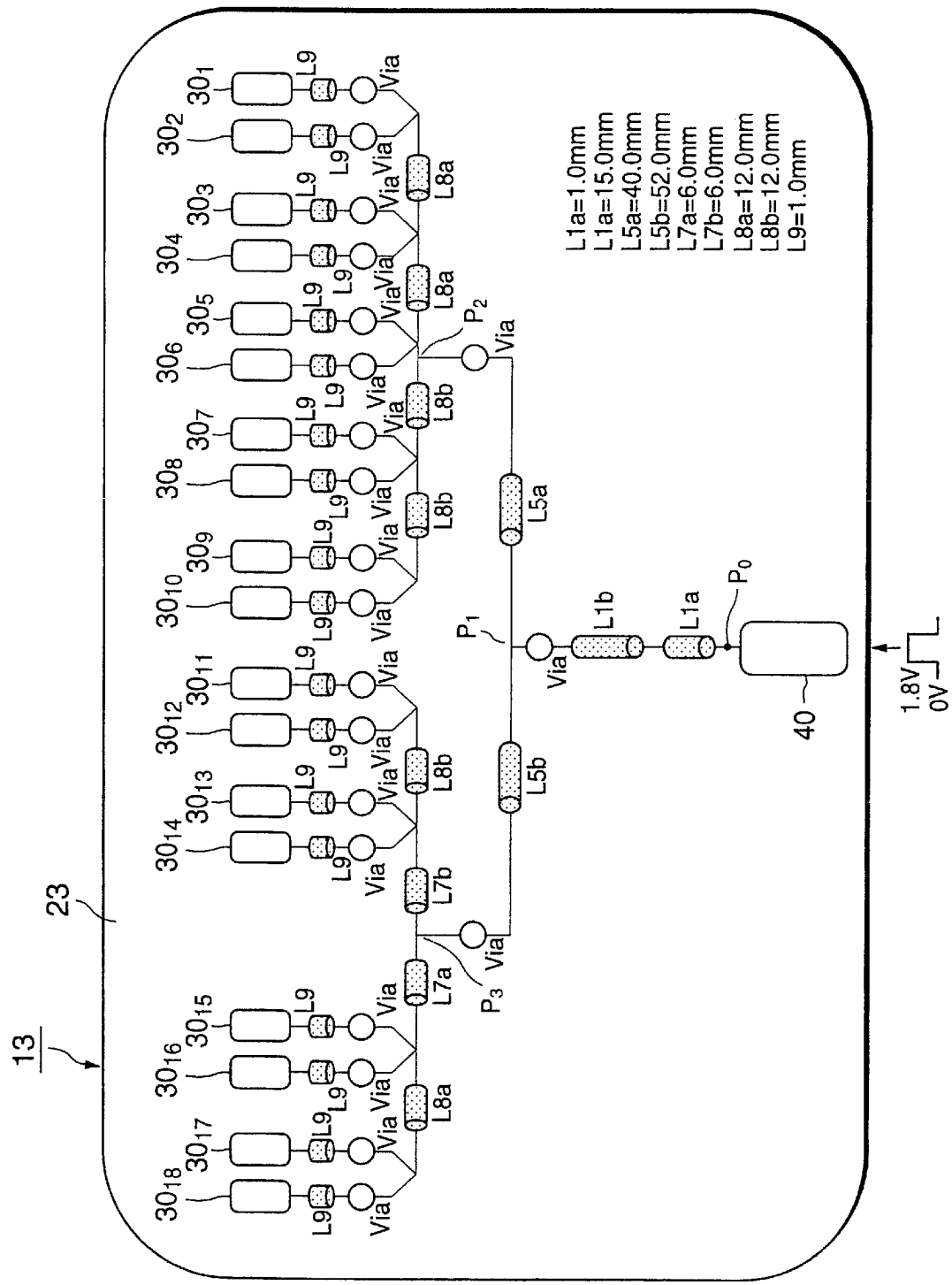
FIG. 10 is a general configuration diagram of a memory module according to a fourth embodiment of the invention.

More specifically, as shown in FIG. 10, lines L1$a$, L1$b$, L5$a$, L5$b$, L7$a$, L7$b$, L8$a$, L8$b$ and L9 are 1.0 mm, 15.0 mm, 40.0 mm, 52.0 mm, 6.0 mm, 6.0 mm, 12.0 mm, 12.0 mm and 1.0 mm long, respectively. It can be seen from this that there is a difference of 12.0 mm between the lengths of the lines L5$a$ and L5$b$. Also, looking at paths from a second branch point $P_2$ to DRAM devices $30_3$, $30_4$, $30_7$ and $30_8$ and paths from a third branch point $P_3$ to DRAM devices $30_{13}$, $30_{14}$, $30_{15}$ and $30_{16}$, one would notice that there is a difference of 6.0 mm in line length between the lines L8$a$, L8$b$ and the lines L7$a$, L7$b$. This difference in line length makes the input impedance of the first group of DRAM devices ($30_1$–$30_{10}$) viewed from a first branch point $P_1$ substantially equal to the input impedance of the second group of DRAM devices ($30_{11}$–$30_{18}$) viewed from the first branch point $P_1$.

The aforementioned approach to impedance balancing of the fourth embodiment is applicable not only to the first embodiment but also to the second and third embodiments.

The memory modules 10–13 of the first to fourth embodiments thus far described were tested by simulation. Test results have proved that it is possible to obtain appropriate output impedance for different numbers of DRAM devices mounted on the module by connecting an adjusting resistor having an electrical resistance determined based on the number of DRAM devices mounted, for example, to the output terminal of the built-in output transistor of the register 40, and that satisfactory pulse waveforms are obtainable by carrying out the aforementioned tR/tF adjustment even when an operating frequency of 150 MHz is employed without using a terminal resistor. To provide a comparative example, a memory module employing a single T-branch topology (in which a topology like the aforementioned first local topology branching out from the second branch point branches out from the first branch point and extends to all DRAM devices) was also tested by simulation. It was, however, impossible to obtain satisfactory pulse waveforms in this comparative example.

While the invention has thus far been described, by way of example, with reference to the memory modules according to its specific embodiments, the scope of the invention is not limited to these embodiments. In the aforementioned first to third embodiments, the resistance R of the resistor 42 built in the C/A register 40 is determined assuming the number of DRAM devices mounted on the memory module is 18 (which is the largest number of DRAM devices) and the additional resistor 44 or 45 is externally added when the number of DRAM devices is smaller. This approach was taken to provide multipurpose applicability of the C/A register 40 so that it is not affected by the number of DRAM devices mounted on the memory module. In a varied form of those embodiments, a resistor having an electrical resistance determined based on the specific number of DRAM devices mounted on the module may be built in the C/A register without taking its multi-purpose applicability into consideration. In another varied form of the embodiments, the resistor 42 may be externally added to the C/A register in all the foregoing embodiments. In still another varied form of the embodiments, multiple resistors having different values of resistance suited to potentially selected numbers of DRAM devices may be built in the C/A register, making it possible to choose the resistor having the right resistance depending on the number of actually mounted DRAM devices.

It would be understood from the foregoing that the resistor for adjusting the output impedance should be provided upstream of the input terminal of the line L1$a$ or L1 (that is, closer to an input terminal of the module). As long as this condition is met, the resistor for adjusting the output impedance may be provided at any location with respect to a conventional C/A register. Thus, the C/A register provided with the impedance-adjusting resistor of this invention corresponds to the C/A register of the related art and, in this sense, the expression "C/A register device" as used in this Specification and the appended claims refers to the C/A register including, or combined with, the impedance-adjusting resistor in contrast to the C/A register itself.

While the invention has been described with reference to the examples employing the C/A register rather than with a mere buffer in the aforementioned embodiments, the invention is applicable not only to registered memory modules but also to buffered memory modules. This is because the impedance-adjusting resistor is provided in a final stage of the C/A register, which constitutes a buffer section as noticed by the inventor.

What is claimed is:

1. A memory module comprising:

a command/address register device for generating an internal signal according to an external command/address signal, said command/address register device having an output transistor;

a plurality of memory devices divided into first and second groups;

wiring interconnecting said command/address register device and said memory devices; and a substrate on which said command/address register device and said multiple memory devices are mounted;

wherein said wiring includes:

a first wiring section extending from said command/address register device to a first branch point;

a second wiring section extending from the first branch point to a second branch point;

a third wiring section extending from the first branch point to a third branch point;

a fourth wiring section which branches out from the second branch point and extends up to the memory devices of said first group; and a fifth wiring section which branches out from the third branch point and extends up to the memory devices of said second group; and said command/address register device includes:

an impedance adjuster for adjusting the output impedance of said command/address register device viewed from a junction point between said command/address register device and the first wiring section in such a manner that said output impedance becomes substantially constant within an operating voltage range of the internal signal; and a rise time/fall time adjuster for adjusting rise time and fall time of the internal signal to specific values.

2. The memory module according to claim 1, wherein neither of said multiple memory devices nor said wiring is terminated.

3. The memory module according to claim 1, wherein said command/address register device is a command/address register including said output transistor and having a register output terminal, said command/address register device including a resistor connected to the register output terminal in series, the resistor serving as the impedance adjuster.

4. The memory module according to claim 3, wherein the resistance of the resistor is larger than the on-state resistance of the output transistor.

5. The memory module according to claim 1, wherein said command/address register device is a command/address register incorporating a resistor serving as the impedance adjuster.

6. The memory module according to claim 1, wherein the impedance adjuster includes first and second resistors, and said command/address register device is a command/address register having a register output terminal and includes the second resistor connected to the register output terminal, the command/address register including the output transistor and the first resistor which is connected between an output terminal of the output transistor and the register output terminal in series.

7. The memory module according to claim 6, wherein the resistance of the first resistor is set to a value which is smallest in consideration of potentially selected numbers of said memory devices, and the resistance of the second resistor is set to a value to be added to the resistance of the first resistor for properly adjusting said output impedance.

8. The memory module according to claim 6, wherein the combined resistance of the first and second resistors is larger than the on-state resistance of the output transistor.

9. The memory module according to claim 1, wherein the command/address it register incorporates a capacitor serving as the rise time/fall time adjuster.

10. The memory module according to claim 1, wherein the impedance adjuster adjusts said output impedance according to the number of said memory devices mounted on said substrate.

11. The memory module according to claim 6, wherein said specific values of the rise time and the fall time remain constant regardless of the potentially selected numbers of said memory devices.

12. The memory module according to claim 11, wherein the frequency of the internal signal is at least 100 MHz.

13. The memory module according to claim 12, wherein the rise time and the fall time fall within a range of 0.9 ns to 2.0 ns.

14. The memory module according to claim 1, wherein the number of the memory devices of said first group is larger than the number of the memory devices of said second group by a specific number and all the memory devices have substantially the same input capacitance with one another, said memory module further comprising:

said specific number of dummy capacitors connected to the fifth wiring section together with the memory devices of said second group, each of the dummy capacitors having substantially the same input capacitance as the individual memory devices;

wherein the combined impedance of the memory devices of said first group viewed from the second branch point is equal to the combined impedance of the memory devices of said second group and the dummy capacitors viewed from the third branch point.

15. The memory module according to claim 14, wherein the second and third wiring sections have equal line impedance and the fourth and fifth wiring sections have equal line impedance.

16. The memory module according to claim 14, wherein the fourth wiring section forms a local topology in which nodes of the memory devices of said first group are arranged symmetrically with respect to a first imaginary line passing through the second branch point, and the fifth wiring section forms a local topology in which nodes of the memory devices of said second group and said specific number of the dummy capacitors are arranged symmetrically with respect to a second imaginary line passing through the third branch point.

17. The memory module according to claim 1, wherein the number of the memory devices of said first group is larger than the number of the memory devices of said second group by a specific number and all the memory devices have substantially the same input capacitance with one another, and line lengths of the second to fifth wiring sections are determined in such a manner that the combined impedance of the memory devices of said first group viewed from the first branch point is equal to the combined impedance of the memory devices of said second group viewed from the first branch point.

18. The memory module according to claim 1, wherein the number of the memory devices of said first group is 8 or 10 while the number of the memory devices of said second group is 8, and the line impedance of the first to fifth wiring sections substantially falls within a range of 50 to 65 ohms while said output impedance is 20 ohms ±20%.

19. The memory module according to claim 1, wherein the number of the memory devices of said first group is 4 or 5 while the number of the memory devices of said second group is 4, and the line impedance of the first to fifth wiring sections substantially falls within a range of 50 to 65 ohms while said output impedance is 25 ohms ±20%.

20. The memory module according to claim 1, wherein the number of the memory devices of said first group is 2 or 3 while the number of the memory devices of said second group is 2, and the line impedance of the first to fifth wiring sections substantially falls within a range of 50 to 65 ohms while said output impedance is 30 ohms ±20%.

21. The memory module according to claim 1 comprising a buffer device including said impedance adjuster and said rise time/fall time adjuster instead of said command/address register device.

* * * * *